US006888184B1

United States Patent
Shi et al.

(12) United States Patent
(10) Patent No.: US 6,888,184 B1
(45) Date of Patent: May 3, 2005

(54) SHIELDED MAGNETIC RAM CELLS

(75) Inventors: Xizeng Shi, Fremont, CA (US); Matthew Gibbons, Livermore, CA (US); Hua-Ching Tong, San Jose, CA (US); Kyusik Sin, Pleasanton, CA (US)

(73) Assignee: Western Digital (Fremont), Inc., Lake Forest, CA (US)

( * ) Notice: Subject to any disclaimer, the term of this patent is extended or adjusted under 35 U.S.C. 154(b) by 183 days.

(21) Appl. No.: 10/074,394

(22) Filed: Feb. 11, 2002

Related U.S. Application Data

(60) Provisional application No. 60/271,195, filed on Feb. 23, 2001.

(51) Int. Cl.$^7$ ............................................. H01L 21/336
(52) U.S. Cl. ........................ 257/293; 257/294; 257/295; 438/3; 438/257; 360/314; 360/315; 360/316
(58) Field of Search ................................ 257/295–293; 360/314–319; 438/257, 3

(56) References Cited

U.S. PATENT DOCUMENTS 5,315,469 A * 5/1994 McNeil ...................... 360/119
5,838,521 A * 11/1998 Ravipati ..................... 360/319
5,898,548 A * 4/1999 Dill et al. ................. 360/324.2
5,902,690 A 5/1999 Tracy et al.
6,055,136 A * 4/2000 Gill et al. ................... 360/314

* cited by examiner

Primary Examiner—Dung A. Le
(74) Attorney, Agent, or Firm—Joshua C. Harrison, Esq.; Sawyer Law Group

(57) ABSTRACT

A magnetic memory fabricated on a semiconductor substrate is disclosed. The method and system include a plurality of magnetic tunneling junctions and a plurality of shields for magnetically shielding the plurality of magnetic tunneling junctions. Each of the plurality of magnetic tunneling junctions includes a first ferromagnetic layer, a second ferromagnetic layer and an insulating layer between the first ferromagnetic layer and the second ferromagnetic layer. At least a portion of the plurality of shields have a high moment and a high permeability and are conductive. The plurality of shields are electrically isolated from the plurality of magnetic tunneling junctions. The plurality of magnetic tunneling junctions are between the plurality of shields.

10 Claims, 4 Drawing Sheets

SHIELDED MAGNETIC RAM CELLS

CROSS-REFERENCE TO RELATED APPLICATION

This application is claiming under 35 U.S.C. §119(e) the benefit of provisional patent application Ser. No. 60/271,195, filed Feb. 23, 2001.

FIELD OF THE INVENTION

The present invention relates to magnetic memory systems, and more particularly to a method and system for providing magnetic shielding for magnetic memory cells.

BACKGROUND OF THE INVENTION

One type of memory currently of interest utilizes magnetic tunneling junctions in the memory cells. A magnetic tunneling junction typically includes two ferromagnetic layers separated by a thin insulating layer. The insulating layer is thin enough to allow charge carriers to tunnel between the ferromagnetic layers. One ferromagnetic layer has its magnetization fixed, or pinned, in place. This is typically accomplished using an antiferromagnetic layer. The other ferromagnetic layer has a magnetization that can rotate in response to an applied magnetic field. The resistance of the magnetic tunneling junction depends upon the orientation of the magnetic tunneling junctions. Thus in order to store data in the magnetic tunneling junction, a magnetic field is applied to rotate the magnetization of one of the layers. Typically, the magnetization of one ferromagnetic layer will be rotated to be parallel or anti-parallel to the magnetization of the other ferromagnetic layer. The magnetic tunneling junction will thus be in either a low resistance (magnetizations parallel) or a high resistance (magnetizations antiparallel) state to represent a "0" or a "1", respectively. A signal corresponding to the resistance is developed in order to indicate the value of the data stored.

In order to utilize magnetic tunneling junctions for storage, the magnetic tunneling junctions should be shielded from stray magnetic fields. If the magnetic tunneling junctions are not shielded, then stray magnetic fields might alter the data stored in the magnetic tunneling junction. Consequently, U.S. Pat. No. 5,902,690 describes the use of insulating ferrite materials to shield magnetic tunneling junctions from stray fields.

Although the ferrite materials may provide some shielding for the magnetic tunneling junctions, one of ordinary skill in the art will readily recognize that the ferrite materials have a relatively low saturation magnetization. As a result, the insulating ferrite materials may not be capable of responding to some of the stray fields to which the magnetic tunneling junctions are exposed. Consequently, the ferrite materials may not be able to shield magnetic tunneling junctions used in a magnetic memory. Thus, the data stored in the magnetic memory may be lost.

Accordingly, what is needed is a system and method for providing a magnetic memory cell having improved shielding. The present invention addresses such a need.

SUMMARY OF THE INVENTION

The present invention provides a magnetic memory fabricated on a semiconductor substrate. The method and system comprise a plurality of magnetic tunneling junctions and a plurality of shields for magnetically shielding the plurality of magnetic tunneling junctions. Each of the plurality of magnetic tunneling junctions includes a first ferromagnetic layer, a second ferromagnetic layer and an insulating layer between the first ferromagnetic layer and the second ferromagnetic layer. At least a portion of the plurality of shields have a high moment and a high permeability and are conductive. The plurality of shields are electrically isolated from the plurality of magnetic tunneling junctions. The plurality of magnetic tunneling junctions are between the plurality of shields.

According to the system and method disclosed herein, the present invention provides a magnetic memory having an amplified output signal.

DETAILED DESCRIPTION OF THE INVENTION

The present invention relates to an improvement in magnetic memories, such as magnetic random access memories (MRAMs). The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a magnetic memory fabricated on a semiconductor substrate. The method and system comprise a plurality of magnetic tunneling junctions and a plurality of shields for magnetically shielding the plurality of magnetic tunneling junctions. Each of the plurality of magnetic tunneling junctions includes a first ferromagnetic layer, a second ferromagnetic layer and an insulating layer between the first ferromagnetic layer and the second ferromagnetic layer. At least a portion of the plurality of shields have a high moment and a high permeability and are conductive. The plurality of shields are electrically isolated from the plurality of magnetic tunneling junctions. The plurality of magnetic tunneling junctions are between the plurality of shields.

The present invention will be described in terms of a particular memory having certain cells and made from particular materials. However, one of ordinary skill in the art will readily recognize that this method and system will operate effectively for other memory arrays having other or additional components not inconsistent with the present invention.

Figure 1:
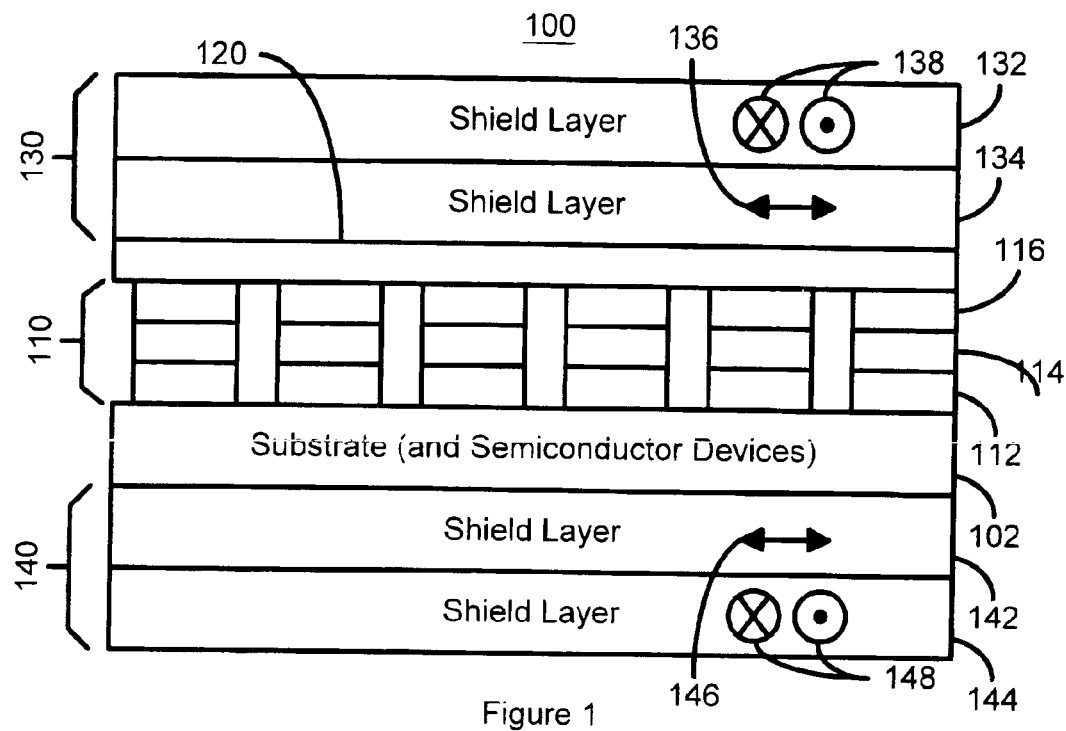
FIG. 1 is a diagram of a portion of a shielded magnetic memory in accordance with the present invention.

To more particularly illustrate the method and system in accordance with the present invention, refer now to FIG. 1 depicting one embodiment of a magnetic memory 100 in accordance with the present invention. The magnetic memory 100 is formed on a semiconductor substrate 102, which preferably includes semiconductor devices, such as integrated circuits. The magnetic memory 100 includes magnetic tunneling junctions 110. Each magnetic tunneling junction 110 includes two ferromagnetic layers 112 and 116 with an insulating layer 114 between the ferromagnetic layers 112 and 116. Charge carriers are capable of tunneling between the ferromagnetic layers 112 and 116. Note that the magnetic tunneling junctions 110 may include other components, such as an antiferromagnetic layer used to pin the magnetization of one of the ferromagnetic layers 112 and 116. The magnetic tunneling junctions 110 are separated by insulator. In addition, an insulating layer 120 is provided on the magnetic tunneling junctions 112.

The magnetic memory 100 also includes shields 130 and 140. The shields 130 and 140 are high moment, high permeability, conductive shields. Because the shields 130 and 140 have a high moment, the saturation magnetization of the shields 130 and 140 is at least 850 memu/cm$^3$. In a preferred embodiment, the saturation magnetization of the shields 130 and 140 is at least 1750 memu/cm$^3$. In a preferred embodiment, therefore, the shields 130 and 140 include FeTaN, FeAlN and/or FeCrN. Also in a preferred embodiment, the high permeability shields 130 and 140 have an anisotropy field of approximately thirty Oe or less. A high permeability and low anisotropy field is desired so that the shields 130 and 140 are capable of responding to lower fields which can deprogram the magnetic tunneling junctions 110. In a preferred embodiment, the shields 130 and 140 have an anisotropy field on the order of the field used to program the magnetic tunneling junctions 110.

In a preferred embodiment, the bottom shield 140 is separated from the magnetic tunneling junctions 110 by the substrate 102, which is preferably approximately 750 μm thick. The top shield 130 is separated from the magnetic tunneling junctions by the insulator 120. The top shield 130 is preferably separated from the magnetic tunneling junctions 110 by approximately 0.5 μm, which is approximately the thickness of a bit line. In a preferred embodiment, the thickness of each of the shields is approximately a few micrometers. However, the thickness of the shields 130 and 140 depends upon the material used and the application for which the magnetic memory 100 is designed.

Because the shields 130 and 140 are composed of a high moment, high permeability conductive material, the shields 130 and 140 offer a low reluctance path for stray magnetic fields. As a result, the shields 130 and 140 can provide a path for stray magnetic fields, preventing the magnetic fields from reaching the magnetic tunneling junctions 110. The shields 130 and 140 can be particularly effective in reducing the ability of magnetic fields parallel to the surface of the shields 130 and 140.

In a preferred embodiment, the shields 130 and 140 have two layers 132 and 134 and 142 and 144, respectively. Each layer 132, 134, 142 and 144 has an easy axis. In a preferred embodiment, the layers 132 and 134 have easy axes 136 and 138 that are perpendicular. Similarly, the layers 142 and 144 preferably have easy axes 146 and 148 that are perpendicular. Because the easy axes 136 and 138 and easy axes 146 and 148 are perpendicular, the shields 130 and 140, respectively, are better able to respond to stray fields of any direction. Consequently, with easy axes 136, 138, 146 and 148, the shields 130 and 140 are better able to shields the magnetic tunneling junctions 110 from stray magnetic fields parallel to the surface of the substrate.

Figure 2:
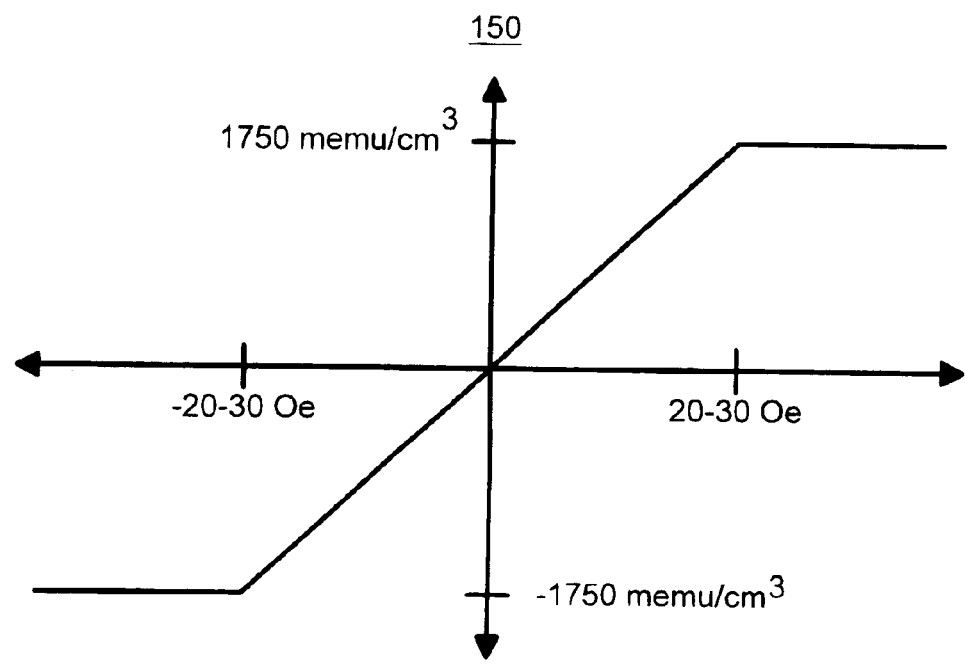
FIG. 2 is a graph depicting one embodiment of desired properties of a material for use in providing a shielded magnetic memory in accordance with the present invention.

FIG. 2 is a graph 150 depicting one embodiment of desired properties of a material for use in providing a shielded magnetic memory in accordance with the present invention. The graph 150 depicts the response of the magnetic materials preferably used in the shields in accordance with the present invention. The saturation magnetization of the material is preferably 1750 memu/cm$^3$ or higher. In addition, the material preferably has an anisotropy field of approximately thirty Oe or less.

Figure 3:
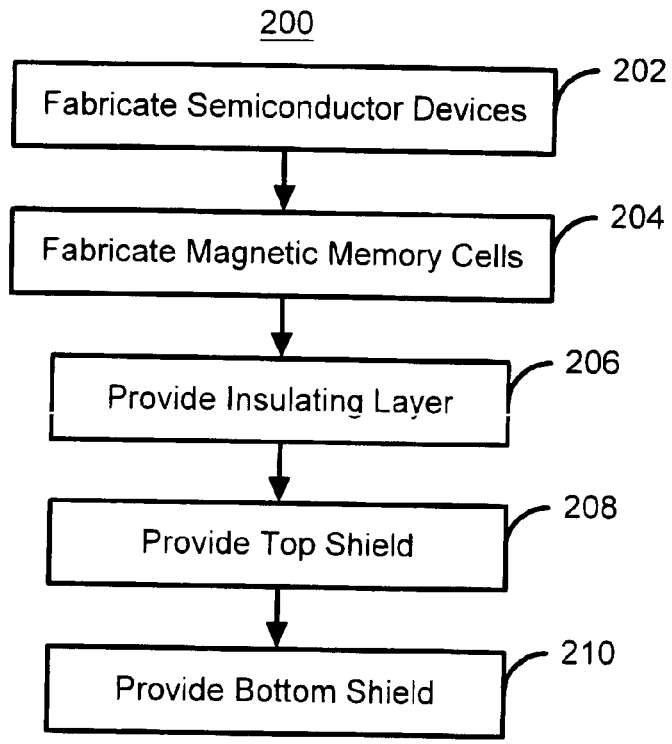
FIG. 3 is a flow chart depicting one embodiment of a method in accordance with the present invention for providing a shielded magnetic memory.
Figure 4A:
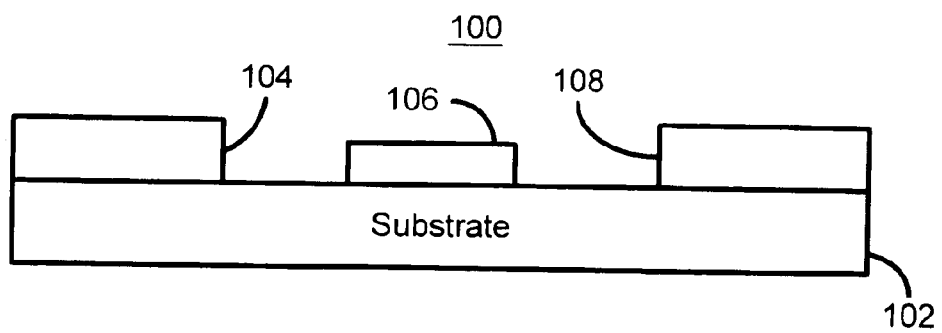
FIGS. 4A–4E depict a shielded magnetic memory in accordance with the present invention during fabrication.
Figure 4B:
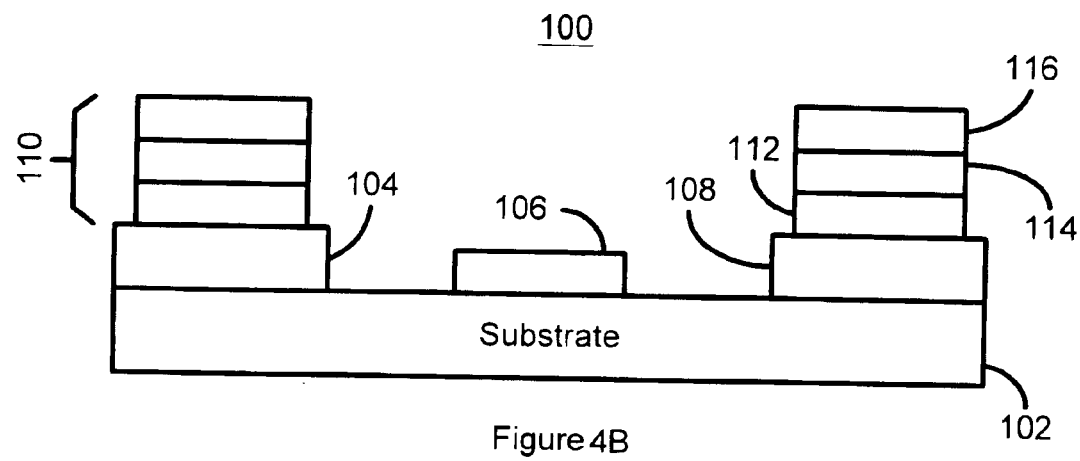
Figure 4C:
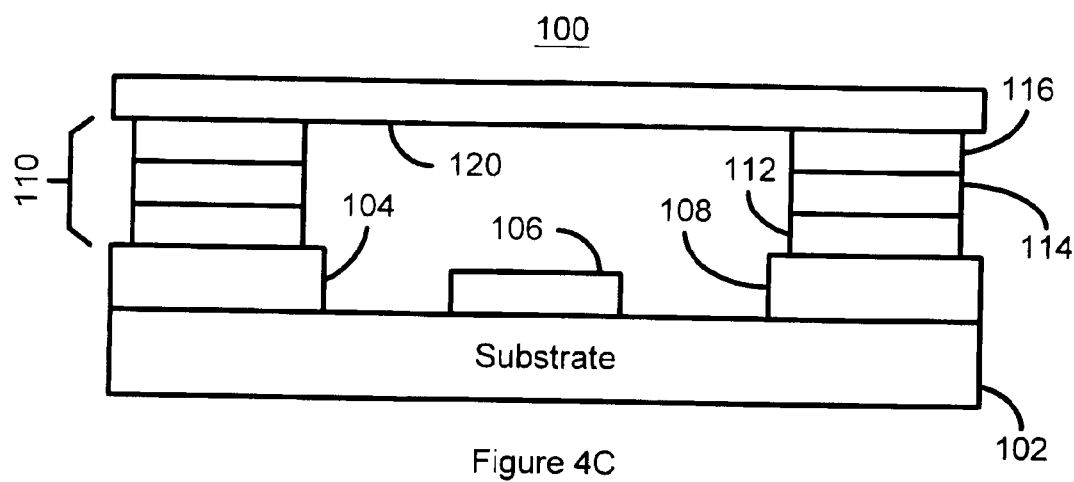
Figure 4D:
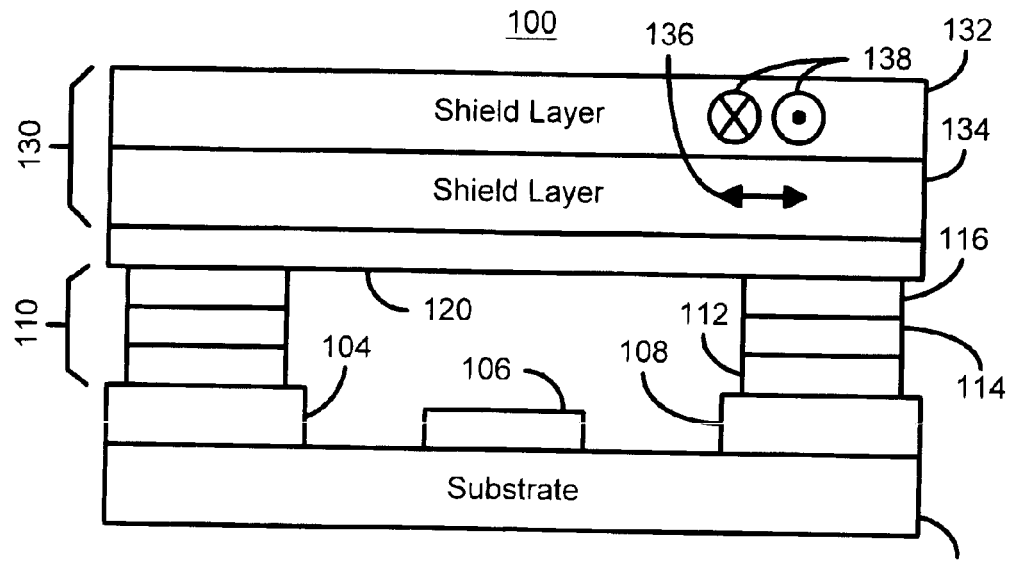
Figure 4E:
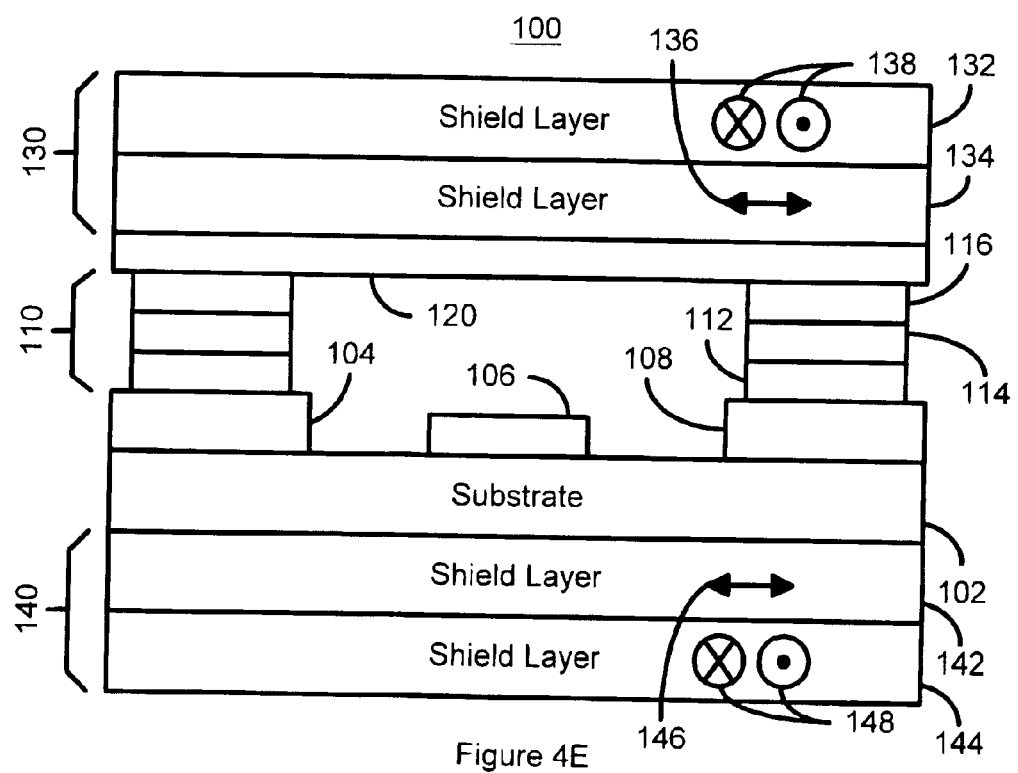

FIG. 3 is a flow chart depicting one embodiment of a method 200 in accordance with the present invention for providing a shielded magnetic memory 100. FIGS. 4A–4E depict a shielded magnetic memory 100 in accordance with the present invention during fabrication. The method 200 is described in conjunction with the magnetic memory 100. Referring to FIGS. 3 and 4A–4E, at least a portion of the semiconductor devices used in the magnetic memory 100 are fabricated, via step 202. The semiconductor devices 104, 106 and 108 are shown on the semiconductor substrate 102 in FIG. 4A. The magnetic memory cells, including the magnetic tunneling junctions 110 are fabricated, via step 204. The magnetic memory 100 including the magnetic tunneling junctions 110 are shown in FIG. 4B. The insulating layer 120 is provided on the magnetic tunneling junctions 110, via step 206. FIG. 4C depicts the magnetic memory 100 after the insulating layer 120 has been provided. The top shield 130 is provided, via step 208. Step 208 preferably includes masking a portion of the magnetic memory 100 and sputtering or electroplating the material for the top shield. Step 208 also includes removing the mask to leave the top shield 130. FIG. 4D depicts the magnetic memory 100 after deposition of the top shield 130. The bottom shield 140 is then provided, via step 210. Step 210 preferably includes masking a portion of the magnetic memory 100 and sputtering or electroplating the material for the bottom shield. Step 210 also includes removing the mask to leave the bottom shield 140. FIG. 4E depicts the magnetic memory 100 after deposition of the bottom shield 140.

Thus, the magnetic memory 100 formed using the method 200 includes shields which have a high moment, a high permeability and are conductive. Thus, the shields can shield the magnetic tunneling junctions from stray magnetic fields. Also in a preferred embodiment, the shields have layers with perpendicular easy axes. As a result, the shields have an improved ability to prevent stray fields in a variety of directions from adversely affecting the magnetic memory 100.

A method and system has been disclosed for providing a shielded magnetic memory array. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic memory fabricated on a semiconductor substrate comprising:

a plurality of magnetic tunneling junctions, each of the plurality of magnetic tunneling junctions including a first ferromagnetic layer, a second ferromagnetic layer and an insulating layer between the first ferromagnetic layer and the second ferromagnetic layer; and a plurality of shields for magnetically shielding the plurality of magnetic tunneling junctions, at least a portion of the plurality of shields having a high moment and a high permeability and being conductive, the plurality of shields being electrically isolated from the plurality of magnetic tunneling junctions, the plurality of magnetic tunneling junctions being between the plurality of shields.

2. The magnetic memory of claim 1 wherein a first shield of the plurality of shields includes a first magnetic layer having a first easy access and a second magnetic layer having a second easy axis perpendicular to the first easy access.

3. The magnetic memory of claim 2 wherein a second shield of the plurality of shields includes a third magnetic layer having a third easy access and a fourth magnetic layer having a fourth easy axis perpendicular to the fourth easy access.

4. The magnetic memory of claim 1 wherein the plurality of shields include FeTaN.

5. The magnetic memory of claim 1 wherein the plurality of shields include FeAlN.

6. The magnetic memory of claim 1 wherein the plurality of shields include FeCrN.

7. The magnetic memory of claim 1 wherein the plurality of shields include a material having a saturation magnetization of greater than or equal to 850 memu/cm$^3$.

8. The magnetic memory of claim 1 wherein the plurality of shields include a material having a saturation magnetization of greater than or equal to 1750 memu/cm$^3$.

9. The magnetic memory of claim 7 wherein the material has an anisotropy field of less than or equal to thirty Oe.

10. The magnetic memory of claim 7 further comprising:

a plurality of semiconductor device coupled to the plurality of magnetic memory cells and residing between the plurality shields.

* * * * *